United States Patent [19]
Quinlan et al.

[11] Patent Number: 5,627,537
[45] Date of Patent: May 6, 1997

[54] DIFFERENTIAL STRING DAC WITH IMPROVED INTEGRAL NON-LINEARITY PERFORMANCE

[75] Inventors: Philip Quinlan; Kenneth T. Deevy, both of Limerick, Ireland

[73] Assignee: Analog Devices, Inc.

[21] Appl. No.: 342,769

[22] Filed: Nov. 21, 1994

[51] Int. Cl.$^6$ .................................................. H03M 1/68
[52] U.S. Cl. .......................................... 341/144; 341/145
[58] Field of Search ...................................... 341/144, 145, 341/118, 155, 156, 159

[56] References Cited

U.S. PATENT DOCUMENTS

| | | | |
|---|---|---|---|
| 4,612,531 | 9/1986 | Dingwall et al. | 340/347 |
| 4,897,658 | 1/1990 | Fujii et al. | 341/161 |
| 4,973,979 | 11/1990 | Ikeda | 341/154 |
| 4,990,916 | 2/1991 | Wynne et al. | 341/147 |
| 5,059,978 | 10/1991 | Valdenaire | 341/145 |
| 5,084,667 | 1/1992 | Drori et al. | 323/298 |

FOREIGN PATENT DOCUMENTS

| | | |
|---|---|---|
| 60-096925 | 10/1985 | Japan . |
| 61-010324 | 1/1986 | Japan . |
| 61-026330 | 2/1986 | Japan . |

OTHER PUBLICATIONS

Razavi et al., A 12-b 5-MSample/s Two-Step CMOS A/D Converter, IEEE Jrnl. of Solid-State Circuits, vol. 27, No. 1, Dec. 1992, pp. 1667-1678.

Shih et al., A CMOS 5-V Analog Front End for 9600-bit/s Facsimile Modems, Ieee Jrnl. of Solid-State Circuits, vol. sc-22, No. 6, Dec. 1987, pp. 990-995.

Brigati et al., "Active Compensation of Parasitic Capacitance for Very High Frequency CMOS DACs", 1993 IEEE International Symposium on Circuits and Systems, vol. 2 of 4, pp. 1208-1211.

*Primary Examiner*—Brian K. Young
*Attorney, Agent, or Firm*—Wolf, Greenfield & Sacks, P.C.

[57] ABSTRACT

A differential string DAC is provided including a coarse DAC which includes a plurality of coarse resistors connected in series between first and second reference voltage leads. A positive sub-DAC includes a plurality of positive sub-DAC cells, each positive sub-DAC cell including a multitude of series-connected fine resistors. A negative sub-DAC includes a plurality of negative sub-DAC cells, each negative sub-DAC cell including a multitude of series-connected fine resistors. Each coarse resistor is electrically connected in parallel with one positive sub-DAC cell and one negative sub-DAC cell. The positive sub-DAC cell and negative sub-DAC cell are substantially symmetrically disposed about the corresponding coarse resistor. Due to the differential arrangement and symmetrical layout of the DAC, INL errors due to process gradients in one direction across the DAC are greatly reduced. Process gradients in a second orthogonal direction are not of great concern as they cause much smaller INL errors.

12 Claims, 11 Drawing Sheets

DIFFERENTIAL STRING DAC WITH IMPROVED INTEGRAL NON-LINEARITY PERFORMANCE

FIELD OF THE INVENTION

The present invention relates generally to a resistor string digital-to-analog converter ("DAC") and, more particularly, to a differential resistor string DAC having a symmetrical resistor layout for minimizing integral non-linearity ("INL") errors caused by resistor fabrication gradients.

BACKGROUND OF THE INVENTION

DACs and analog-to-digital converters ("ADCs") have recently come into more widespread use with the development of suitable process technology and the increase in digital audio and other applications. One common type of ADC is the all-parallel, or so-called "flash", converter which provides a relatively fast conversion. DACs are commonly used in flash ADCs to provide reference voltage output taps. Such DACs are described, for example, in Analog-Digital Conversion Handbook, Third Edition, by Analog Devices, Inc.

A typical multi-phase flash ADC is shown in block diagram form in FIG. 1. As shown, the n-bit flash ADC includes an analog input lead 10, a DAC 12, $2^m-1$ (where m<n) latched comparators (labeled LC1 through $LC2^m-1$), a control signal lead 14, and an encoding logic unit 16. An analog input signal is received on analog input lead 10 and provided to each of the $2^m-1$ latched comparators. DAC 12 is a so-called "string DAC" and includes $2^n$ resistors (labeled R1 through $R2^n$) connected in series between reference voltage $V_{REF}$ and ground. All nodes between the $2^n$ resistors are used to provide comparator reference voltages and are connected to the inputs of switch matrix 13. The switch matrix is used to connect a subset of these DAC reference voltages to the latched comparator inputs during each phase of the ADC conversion. The control signal lead 14 is connected to each of the latched comparators and receives the control signal ENCODE COMMAND for controlling operation of the comparators. Each comparator provides an output to encoding logic unit 16 which, in turn, provides an n-bit digital output.

$2^n-1$ different reference voltages are provided by the string DAC 12 to the switch matrix 13. The switch 13 provides appropriate reference voltages to the $2^m-1$ comparators. The reference voltages provided by the string DAC 12 differ between adjacent taps by a voltage level corresponding to one least-significant bit ("LSB") of the digital output code. Each comparator performs a comparison of the analog input signal with the appropriate reference voltage received from switch matrix 13 upon receipt of the ENCODE COMMAND signal; it then provides a binary output signal to encoding logic unit 16. Each comparator that receives a reference voltage which is less than the voltage of The input signal will output a signal corresponding to a logical "one" and each comparator that receives a reference voltage which is greater than that of the input signal will output a signal corresponding to a logical "zero".

The encoding logic unit 16 then converts the thermometer output code of the comparators to an n-bit digital output code. As will be understood by those skilled in the art, the digital output signal may be in different formats such as binary, Gray code, or other. Another digital output signal is provided along bus 15 to switch control logic unit 17 which provides control signals along line 19 to control operation of the switch matrix 13. Typically, the n-bit digital output signal is produced in multiple phases. Multi-phase flash ADCs are known in which a multi-bit conversion occurs over a number of phases or time intervals. In a multi-phase flash ADC, the digital output signal during a first phase controls the operation of the switches within switch matrix 13 during an immediately subsequent phase. A typical 10-bit flash ADC, for example, operates in three phases in which the four MSBs are generated during phase 1, the next three less-significant bits are generated during phase 2, and the three LSBs are generated during phase 3. Those skilled in the art will appreciate that during each subsequent phase, the string DAC produces a "finer" set of reference voltages (i.e., the reference voltages of a subsequent phase are closer in value to the input signal than those of a previous phase) for comparison to the analog input signal.

During a first phase, the string DAC provides a first set of "coarse" reference voltages to the comparators for comparison with the analog input signal. A set of the most-significant bits (MSB) of the digital output code is generated during the first phase. During the second and immediate subsequent phase, the digital output code generated during the first phase controls the switches within the switch matrix 13 for providing a finer set of reference voltages to the comparators. During this second phase, a set of less-significant bits (i.e., of lesser significance, bit-wise, than the MSBs generated during the first phase) is generated. The digital output code from the second phase, in turn, controls the switches within the switch matrix 13 during the third phase and an even finer set of reference voltages is provided to the comparators for generation of the LSBs of the output code.

Ideally, the string DAC should produce an analog output signal which linearly increases as the digital input code increases. However, as will be readily appreciated by those skilled in the art, the analog output signal of most DACs tend to be non-linear. INL error is the maximum deviation at any point in the transfer function (a graph of the analog output signal verses the digital input code) of the output voltage level from its ideal level. INL errors of a string DAC used in a flash ADC may affect the accuracy of the ADC output.

INL errors in string DACs can be caused by gradients in the resistance values of the resistors within the string DAC. The gradients are typically caused by process inaccuracies (i.e., mismatches in sheet resistance values which occur during fabrication). While string DACs typically include a large number of resistors which ideally have the same resistance value, process gradients result in such resistors having different values. The gradients can be linear, non-linear or random and each can cause INL errors.

Accordingly, a general object of the present invention is to provide a string DAC having reduced INL errors due to resistor process gradients.

Other objects and advantages will be apparent from the detailed description below.

SUMMARY OF THE INVENTION

A string DAC according to the present invention includes a coarse DAC and two finer sub-DACs, wherein the sub-DACs are substantially symmetrically disposed about the coarse DAC.

More particularly, in accordance with the present invention, a differential string DAC includes a coarse DAC having a plurality of coarse resistors connected in series between first and second reference voltage leads. A positive sub-DAC includes a plurality of positive sub-DAC cells, each positive sub-DAC cell including a multitude of series-connected fine resistors. A negative sub-DAC cell includes a plurality of negative sub-DAC cells, each negative sub-DAC cell including a multitude of series-connected fine resistors. Each coarse resistor has one positive sub-DAC cell and one negative sub-DAC cell electrically connected in parallel therewith. The positive sub-DAC cell and the negative sub-DAC cell are substantially symmetrically disposed on opposite sides of the coarse resistor.

As used herein, "a coarse resistor" refers to a resistor having a resistance value greater than that of a "fine resistor". Similarly, "fine resistor" refers to a resistor having a resistance value less than that of a "coarse resistor". A "coarse DAC" includes a plurality of coarse resistors connected in series between two reference voltages and a set of switches connected to nodes between the coarse resistors. Similarly, a "sub-DAC" includes a plurality of fine resistors connected in series between two reference voltages and a set of switches connected to nodes between the fine resistors.

In accordance with a preferred embodiment of the present invention, the coarse DAC includes thirty-two coarse resistors. In a preferred embodiment, all coarse resistors have approximately the same resistance value.

In accordance with a preferred embodiment of the present invention, the positive sub-DAC includes sixteen positive sub-DAC cells and the negative sub-DAC includes sixteen negative sub-DAC cells. Additionally, in a preferred embodiment, each sub-DAC cell includes sixty-four series-connected fine resistors. Further, in a preferred embodiment, all fine resistors have approximately the same resistance value.

DETAILED DESCRIPTION

By contrast with prior art differential string DACs which typically include positive and negative sub-DACs physically located physically on the same side of a coarse DAC, the present invention includes positive and negative sub-DACs which are symmetrically disposed about a coarse DAC with respect to one another. The layout of the differential string DAC of the present invention is described in more detail below.

Figure 2:
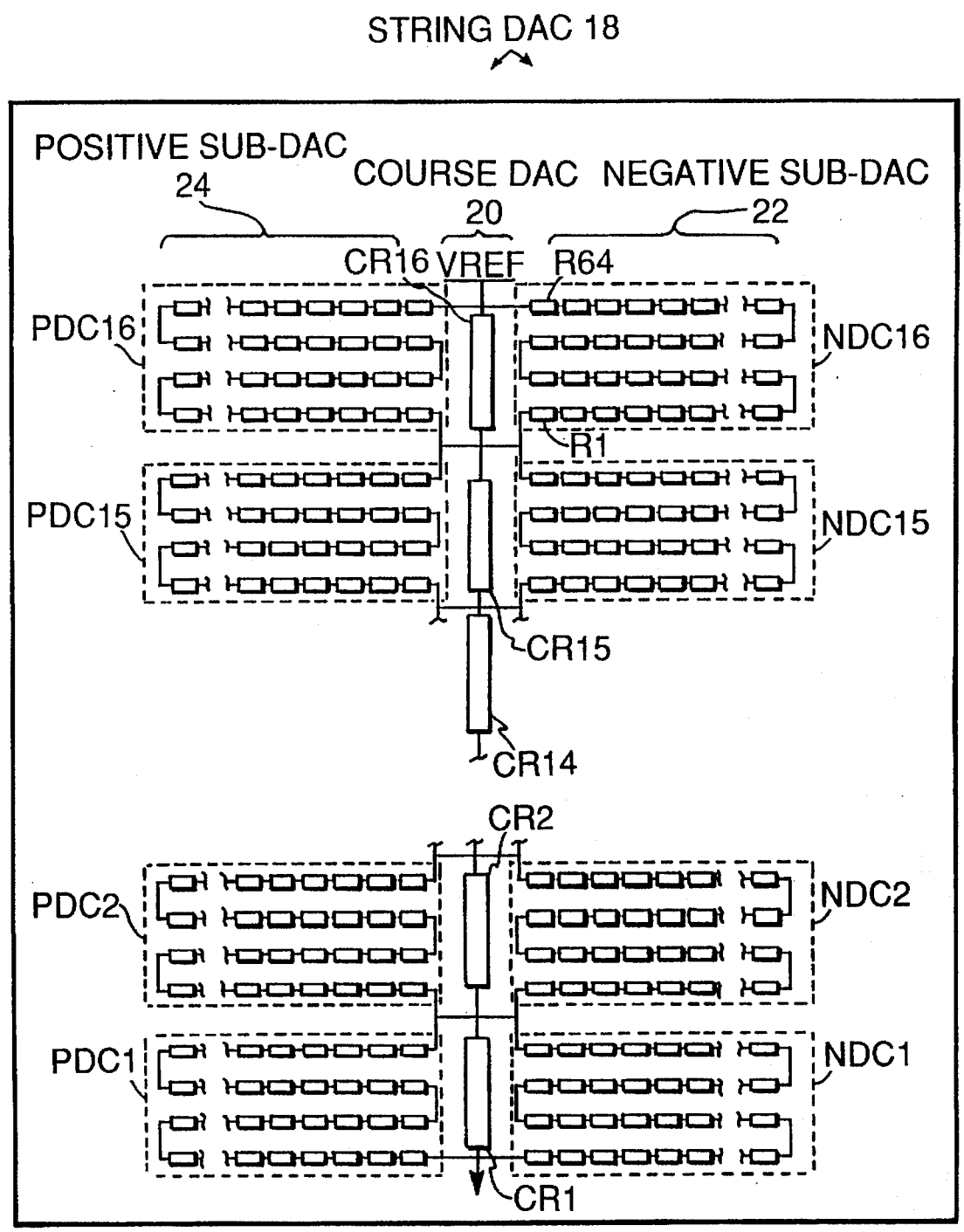
FIG. 2 is a partially cutoff block diagram of a string DAC according to the present invention.

FIG. 2 is a block diagram of the string DAC 18 of the present invention. FIG. 2 schematically represents the connections of resistors and also is diagrammatic of the physical layout of the resistors. As shown, string DAC 18 includes a coarse DAC 20 and two finer sub-DACs, a negative sub-DAC 22 and a positive sub-DAC 24. The coarse DAC 20 includes a "string" of sixteen coarse resistors CR1–CR16 connected in series between a reference voltage lead, receiving a reference voltage $V_{REF}$, and ground. All of the coarse resistors preferably have the same resistance value and there is no "fold" in the layout of the course DAC.

Each sub-DAC includes sixteen sub-DAC cells. The negative sub-DAC cells are labeled NDC1–NDC16 and the positive sub-DAC cells are labeled PDC1–PDC16. Each sub-DAC cell includes sixty-four resistors connected in series. The resistors of one sub-DAC cell are labeled R1–R64. The other sub-DAC cells are the same. Each negative sub-DAC cell is electrically connected in parallel with a corresponding coarse resistor. Similarly, each positive sub-DAC cell is electrically connected in parallel with a corresponding coarse resistor and is symmetrically disposed about the coarse resistor with respect to the negative sub-DAC cell. For example, negative sub-DAC cell NDC16 and positive sub-DAC cell PDC16 are both connected in parallel with coarse resistor CR16 and are symmetrically disposed about coarse resistor CR16 with respect to one another.

Figure 3:
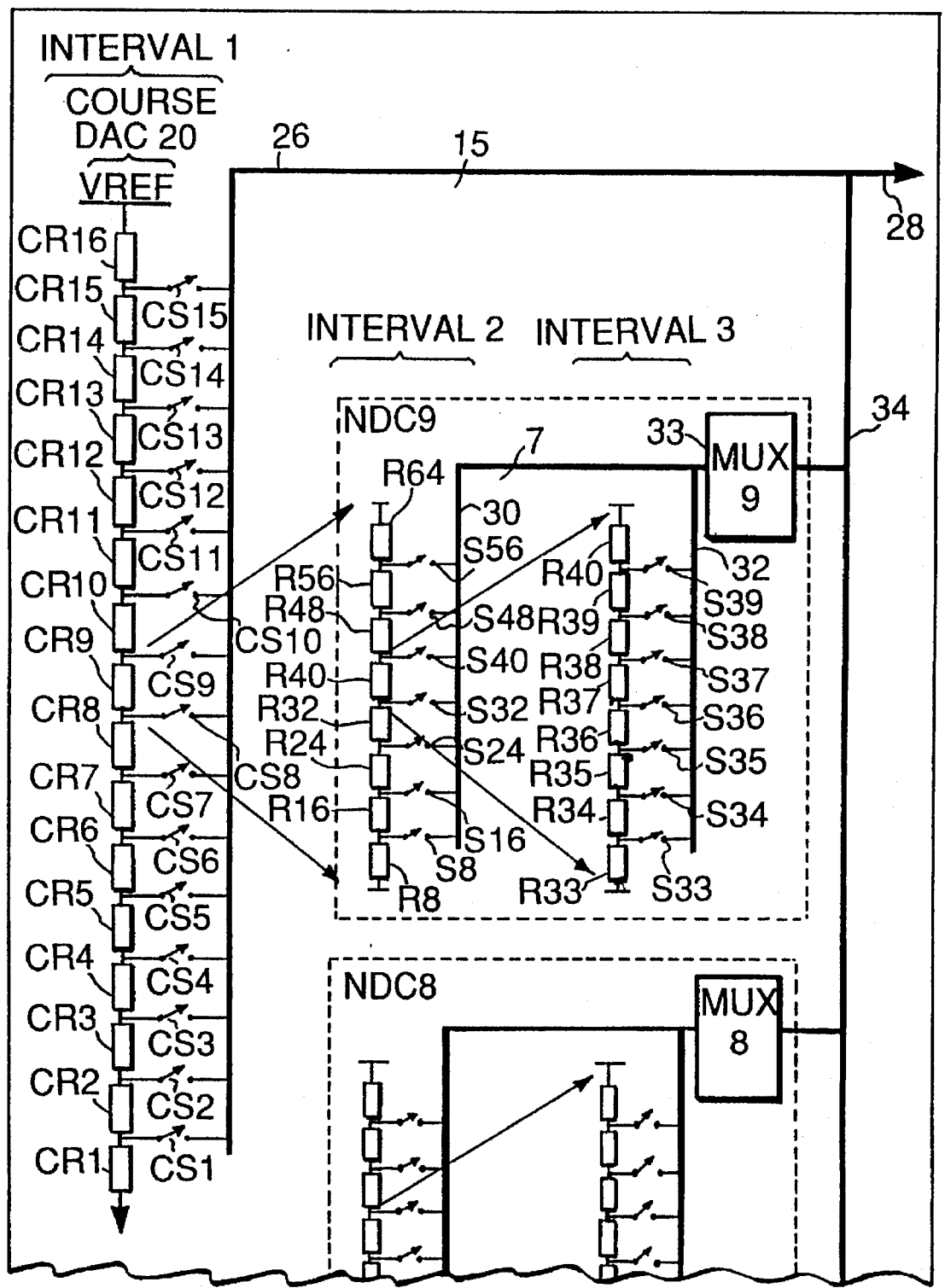
FIG. 3 is a partial block diagram, partial flow chart, illustrating the operation of the string DAC of FIG. 2.

Operation of the string DAC for use with a 10-bit flash ADC will be described with reference to the partial block, partial flow diagram of FIG. 3. Shown in FIG. 3 is the coarse DAC 20 including the sixteen coarse resistors CR1–CR16 as well as the negative sub-DAC cell NDC9 and part of the negative sub-DAC cell NDC8. Only single-ended operation is illustrated in FIG. 3. However, as will be understood by those skilled in the art, the string DAC of the present invention includes a differential arrangement in which operation of the positive sub-DAC 24 is identical to, and simultaneous with, operation of the negative sub-DAC 22.

The coarse DAC 20 includes, in addition to the sixteen coarse resistors, fifteen coarse switches, labeled CS1–CS15, connecting the nodes between all pairs adjacent coarse resistors to bus 26. Bus 26 is a 15-bit bus for providing the fifteen reference voltages from the coarse DAC 20 to fifteen comparators (not shown). Each sub-DAC cell includes, in addition to the sixty-four series-connected fine resistors R1–R64, sixty-four switches S1–S64 (not all of the switches are shown in FIG. 3) which connect the nodes between all pairs of adjacent fine resistors to an output bus for providing the reference voltages to the comparators.

In each sub-DAC cell, the seven switches S8, S16, S24, S40, S48 and S56 connected to the node above every eighth resistor R8, R16, R24, R32, R40, R48 and R56, respectively, are controlled by the same control signal such that they will be turned on (i.e., will be closed and conduct current) at the same time. In addition, of the remaining switches, eight groups of seven adjacent switches S1–S7, S9–S15, S17–S23, S25–S31, S33–S39 (the only group shown in FIG. 3), S41–S47, S49–57 and S57–S63, are each controlled by a different control signal such that all of the switches of only one of the eight groups are turned on simultaneously. The operation of the switches of the coarse DAC and sub-DAC is described in detail below.

Figure 1:
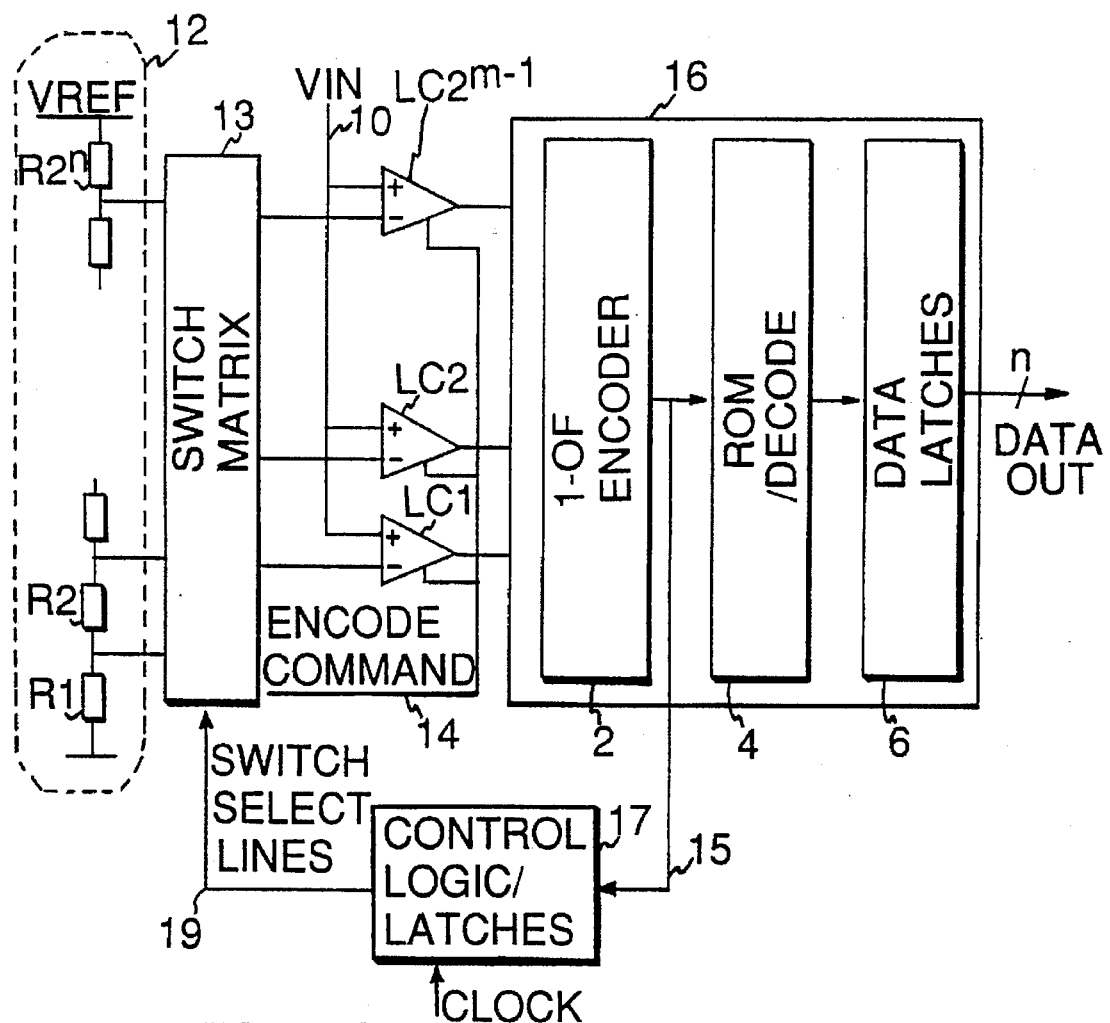
FIG. 1 is a block diagram of a prior art flash ADC.

The string DAC operates in three phases or time intervals, labeled on FIG. 3 as intervals 1, 2 and 3. During interval 1, each coarse switch CS1–CS15 of coarse DAC 20 is closed so that fifteen different reference voltages are provided on bus 26 to bus 28. Bus 28 provides the voltages as separate inputs to fifteen comparators (not shown). As described above in connection with the prior art flash ADC of FIG. 1, each comparator compares the received reference voltage to the analog input signal of the ADC and provides an output to an encoding logic unit which, in turn, generates a set of MSBs of the digital output code. For a 10-bit ADC, for example, the four MSBs of the digital output code may be generated during interval 1.

During interval 2, the seven switches S8, S16, S24, S32, S40, S48 and S56, respectively connected to every eighth resistor R8, R16, R24, R32, R40, R48 and R56 are turned on in each sub-DAC cell NDC1–NDC16 (and PDC1–PDC16 for differential operation). Therefore, in each sub-DAC cell, seven reference voltages will be provided through the switches to 7-bit bus 30. The seven reference voltages are provided from bus 30 to bus 33 as seven inputs to multiplexer MUX9.

Each sub-DAC cell includes an identical multiplexer (only the multiplexers for negative sub-DAC cells NDC8 and NDC9 are shown and are labeled MUX8 and MUX9, respectively). Each multiplexer includes seven separate inputs and seven separate outputs and essentially acts a transmission gate. In other words, when the multiplexer is enabled, the seven inputs are provided as seven outputs. Conversely, when the multiplexer is disabled, the seven input signals are prevented from flowing through the multiplexer.

During interval 2, the multiplexers of the sub-DAC cells NDC1–NDC16 (and PDC1–PDC16) are controlled by the digital output code generated during interval 1. Only one multiplexer corresponding to one of the negative sub-DAC cells (and one multiplexer corresponding to one of the positive sub-DAC cells for differential operation) is enabled during interval 2, and the remaining negative sub-DAC cell multiplexers (and positive sub-DAC cell multiplexers) are disabled.

In the example of FIG. 3, multiplexer MUX9 is the only negative sub-DAC multiplexer enabled during interval 2. Negative sub-DAC cell NDC9 is connected in parallel with coarse resistor CR9 of the coarse DAC. As will be appreciated by those skilled in the art, multiplexer MUX9, corresponding to the negative sub-DAC cell NDC9, would be enabled if approximately a mid-scale output code is generated during interval 1. By enabling multiplexer MUX9 and disabling multiplexers MUX1–MUX8 and MUX10–MUX16, only the reference voltages provided along bus 30 in negative sub-DAC cell NDC9 will be outputted to 7-bit bus 34. Bus 34 provides the seven reference voltages to bus 28 which, in turn, provides the seven reference voltages as separate inputs to seven comparators. As during interval 1, each comparator compares the received reference voltage to the analog input voltage and provides an output signal to an encoding logic unit which, in turn, generates a next set of less-significant bits. For the example of a 10-bit flash ADC, interval 2 may produce the next three less-significant bits.

During interval 3, the digital output code generated during interval 2 controls the eight groups of seven adjacent switches (discussed above) such that only one of the groups of seven adjacent switches is turned on (each of the seven switches in that particular group is turned on). For the example shown in FIG. 3, the group including switches S33–S39 is turned on, those switches being connected to the nodes between adjacent resistors R33–R40. Such action occurs in each negative sub-DAC cell (and positive sub-DAC cell) so that seven reference voltages are provided on bus 32 to the 7-bit input bus 33 of the multiplexer in each sub-DAC cell.

The same multiplexer that was enabled during interval 2, in the present example multiplexer MUX9, remains enabled during interval 3, with all of the other multiplexers of the other sub-DAC cells remaining disabled. Therefore, only the seven reference voltages from one of the negative sub-DAC cells (and from one of the positive sub-DAC cells for differential operation) are output from the multiplexer to bus 34. As during intervals 1 and 2, the seven reference voltages are provided along bus 34 to bus 28 where they are provided as inputs to seven comparators. Each comparator compares the received reference voltage to the analog input voltage and provides an output to an encoding logic unit which, in turn, generates a set of LSBs of the digital output code. In the example of a 10-bit ADC, the three LSBs are generated during interval 3.

While the single-ended operation is illustrated in FIG. 3 and described above, the string DAC of the present invention is a differential string DAC in which operation of the positive sub-DAC is identical to that of the negative sub-DAC. The coarse DAC 20 of the present invention therefore includes a second set of fifteen switches (not shown) corresponding to the positive side of the coarse DAC 20 which, like switches CS1–CS15 (corresponding to the negative side of coarse DAC 20), are connected to the nodes between each of the coarse resistors CR1–CR16. As will be appreciated by those skilled in the art, during each interval, differential reference voltages are provided by the string DAC to the comparators for comparison with a differential analog input voltage. Each differential reference voltage produced includes a negative reference voltage component and a positive reference voltage component. During interval 1, for example, one differential reference voltage produced by the DAC includes a positive component flowing through a switch (not shown) connected opposite switch CS15 (on the positive side of the coarse DAC 20) and a negative component flowing through switch CS1. Another differential reference voltage includes a positive component flowing through a switch (not shown) connected opposite switch CS14 and a negative component flowing through switch CS2, etc.

Figure 4:
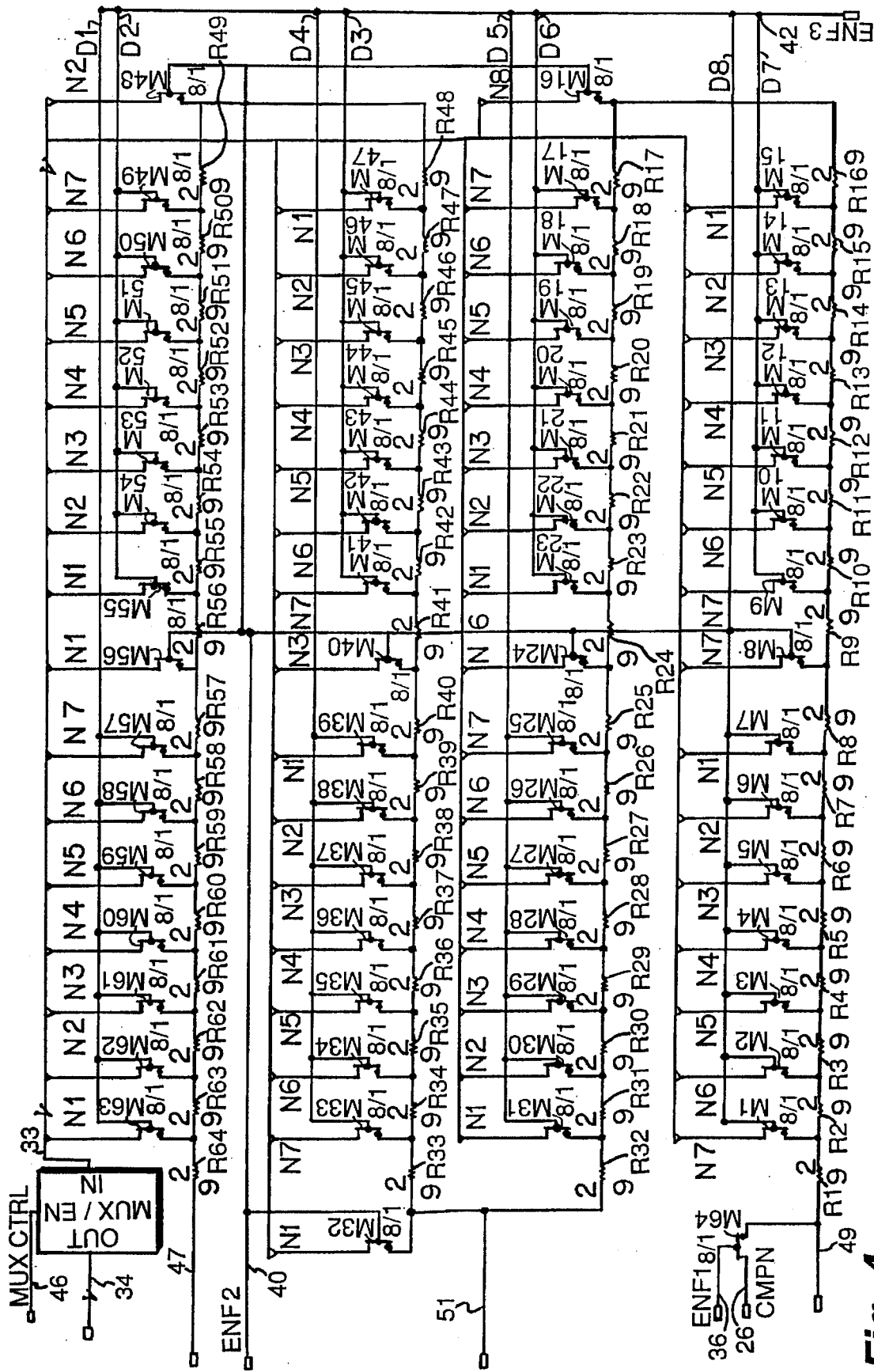
FIG. 4 is a detailed schematic diagram of a particular implementation of one of the sub-DAC cells of the string DAC of the present invention.

A particular and preferred implementation of a sub-DAC cell of the present invention is shown in the schematic diagram of FIG. 4. As shown, the sub-DAC cell includes sixty-four resistors, labeled R1–R64, connected in series. Sixty-three switches, implemented by the transistors M1–M63, are connected to the nodes between the series-connected resistors. A sixty-fourth transistor M64 is connected to a coarse resistor (not shown). The gates of every eighth transistor, M8, M16, M24, M32, M40, M48, M56 and M64 are connected together and to a lead 40, receiving the gate control signal ENF2. The gate control signal ENF2 turns on each eighth transistor during interval 2 (as described above).

Of the remaining transistors, eight groups of seven adjacent transistors M1–M7, M9–M15, M17–M23, M25–M31, M33–M39, M41–M47, M49–M57 and M57–M63 have their gates tied together and to 8-bit bus 42 which receives the 8-bit gate control signal ENF3. Gate control signal ENF3 selects one of the eight groups of seven adjacent transistors to turn on during interval 3 (as described above).

Each of the transistors M1–M63 provides an output to 7-bit multiplexer input bus 33. Multiplexer MUX1 is either enabled or disabled during intervals 2 and 3 (as described above). Multiplexer MUX1 receives an enable/disable control signal MUXCTRL on line 46 for enabling and disabling the multiplexer. The multiplexer provides a 7-bit output on bus 34 to the comparators (not shown). Also shown are lines 47 and 49 which are connected across the corresponding coarse resistor. In the preferred embodiment of the present invention, each coarse resistor includes two series-connected coarse resistors. A third line 51 is connected between the two series-connected coarse resistors.

Transistor M64 is connected by line 49 to the respective coarse resistor. Transistor M64 receives gate control signal ENF1 on line 36. Gate control signal ENF1 turns on transistor M64 during interval 1 (as described above). The output of the transistor is provided on bus 26 to a respective comparator input.

FIGS. 5–11 are graphs which illustrate the advantages of the differential string DAC of the present invention with respect to INL errors. Specifically, FIGS. 5–11 illustrate the relative INL errors of single-ended DACs and the differential DAC of the present invention under conditions of linear and non-linear process gradients.

Figure 5:
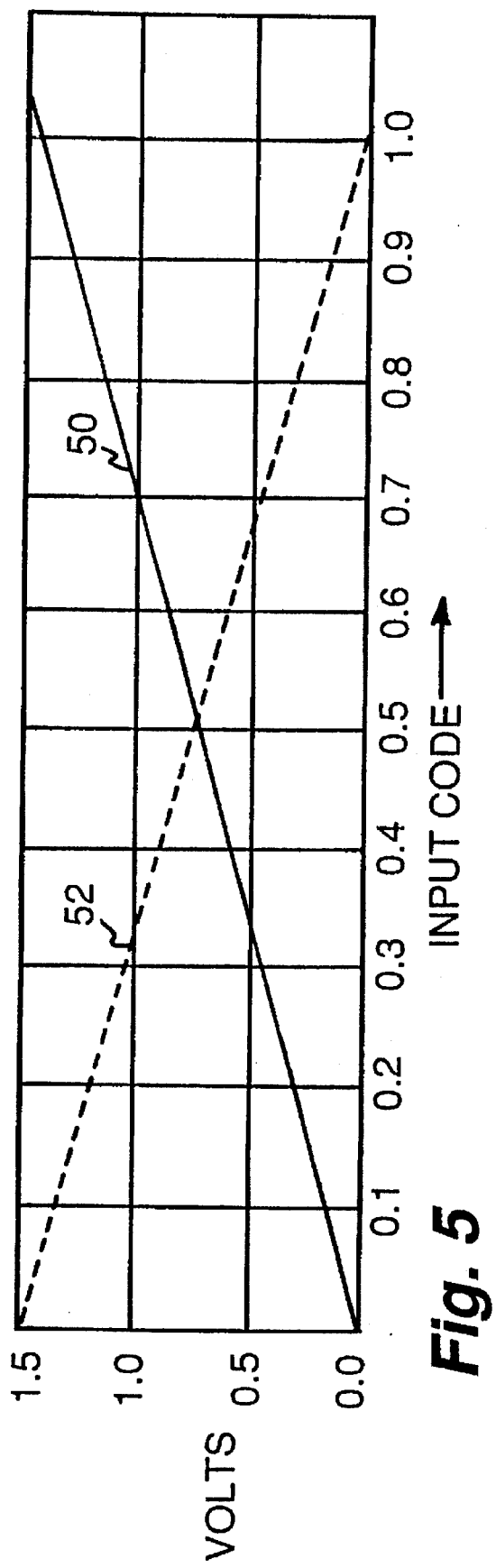
FIG. 5 is a graph of the transfer function of a single-ended string DAC having a one percent linear process gradient across its surface.

FIG. 5 shows the transfer functions of a positive single-ended DAC and a negative single-ended DAC having a one percent linear process gradient across the DAC in the vertical direction (i.e., from top to bottom or from bottom to top) at a temperature of 27° C. The vertical axis represents the output voltage in volts and the horizontal axis represents the digital input code. Curve 50 shows the output of the positive string DAC and curve 52 (dashed lines) shows the output of the negative string DAC.

Figure 6:
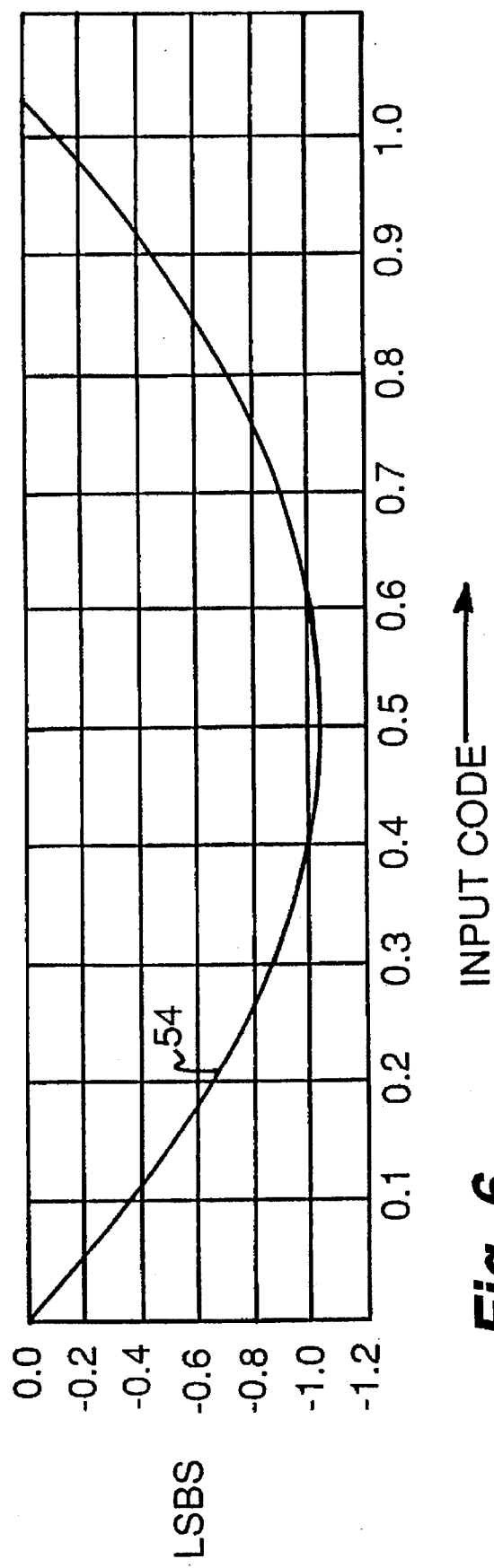
FIG. 6 is a graph of the INL error of a single-ended string DAC having a one percent linear process gradient across its surface.

FIG. 6 shows a graph of the INL errors in LSBs for the positive single-ended DAC and the negative single-ended DAC, the transfer functions of which are shown in FIG. 5 (and under the conditions described above with reference to FIG. 5). The vertical axis of the graph represents the INL errors in fractions of LSBs and the horizontal axis of the graph represents the digital input code of the DACs. Curve 54 shows the INL error, which is substantially the same for the positive single-ended string DAC and the negative single-ended string DAC. The slight variations in the INL errors of the positive and negative string DAC cannot be seen in FIG. 6 due to the insufficient resolution of the vertical scale. As shown, at approximately mid-scale code, the INL error is greater than 1 LSB. In this example, a 1% linear gradient in the Y direction causes a maximum INL error of approximately 1 LSB.

Figure 7:
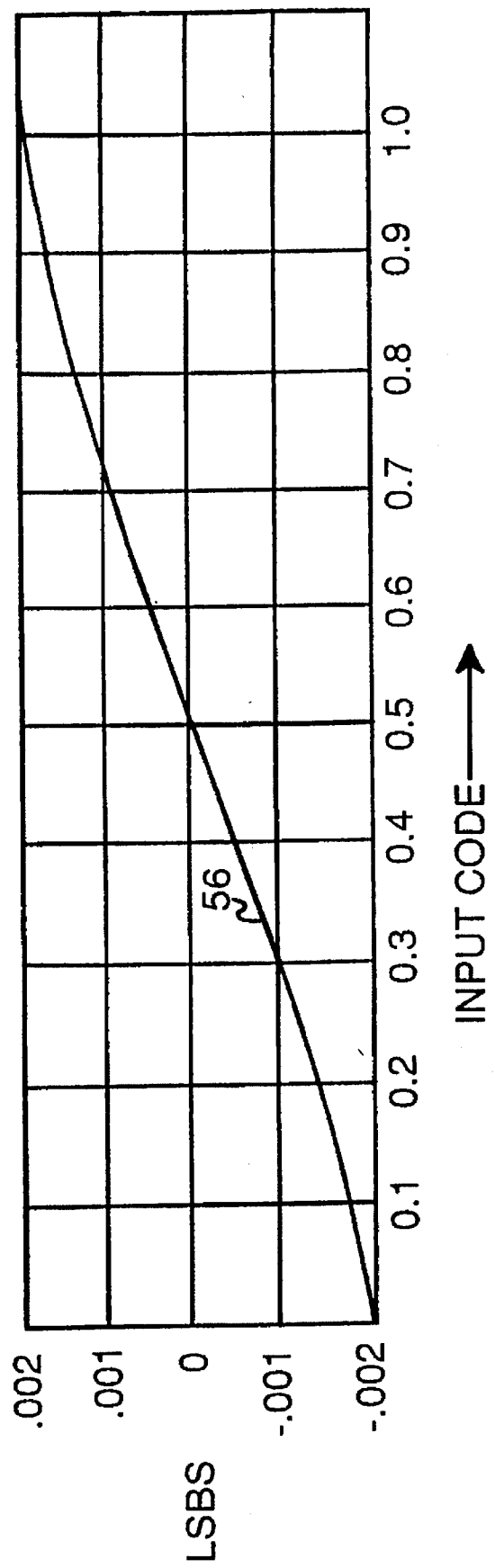
FIG. 7 is a graph of the INL error of the differential string DAC according to the present invention having a one percent linear process gradient across its surface.

FIG. 7 is a graph showing the INL error (in LSBs) of the differential string DAC of the present invention given the conditions of the single-ended DACs described with reference to FIGS. 5 and 6, that is, having a one percent linear vertical process gradient. As those skilled in the art will understand, the INL error of the differential string DAC will be approximately the difference between the INL errors of the positive single-ended string DAC and the negative single-ended string DAC. The vertical axis of FIG. 7 represents the INL errors in fractions of LSBs and the horizontal axis of FIG. 7 represents the digital input code of the differential string DAC. Curve 56 shows the INL error of the differential string DAC which is approximately equal to zero.

As shown, the INL error varies between ±0.002 LSB. Note that the slight variation in INL errors between the positive single-ended string DAC and the negative single-ended string DAC (which cannot be seen in FIG. 6) is illustrated in FIG. 7 due to the vertical scale of greater resolution (the vertical axis of FIG. 7 includes unit steps of 0.001 LSB each and the vertical axis of FIG. 6 includes unit steps of 0.2 LSB each). As shown, for mid-scale input code, the INL error is approximately equal to 0 for the differential string DAC by contrast with the mid-scale code INL error of greater than 1 LSB for the single-ended string DAC (see FIG. 6). Therefore, the INL errors of the differential string DAC of the present invention are far less than that of a single-ended string DAC given a one percent vertical linear process gradient.

Figure 8:
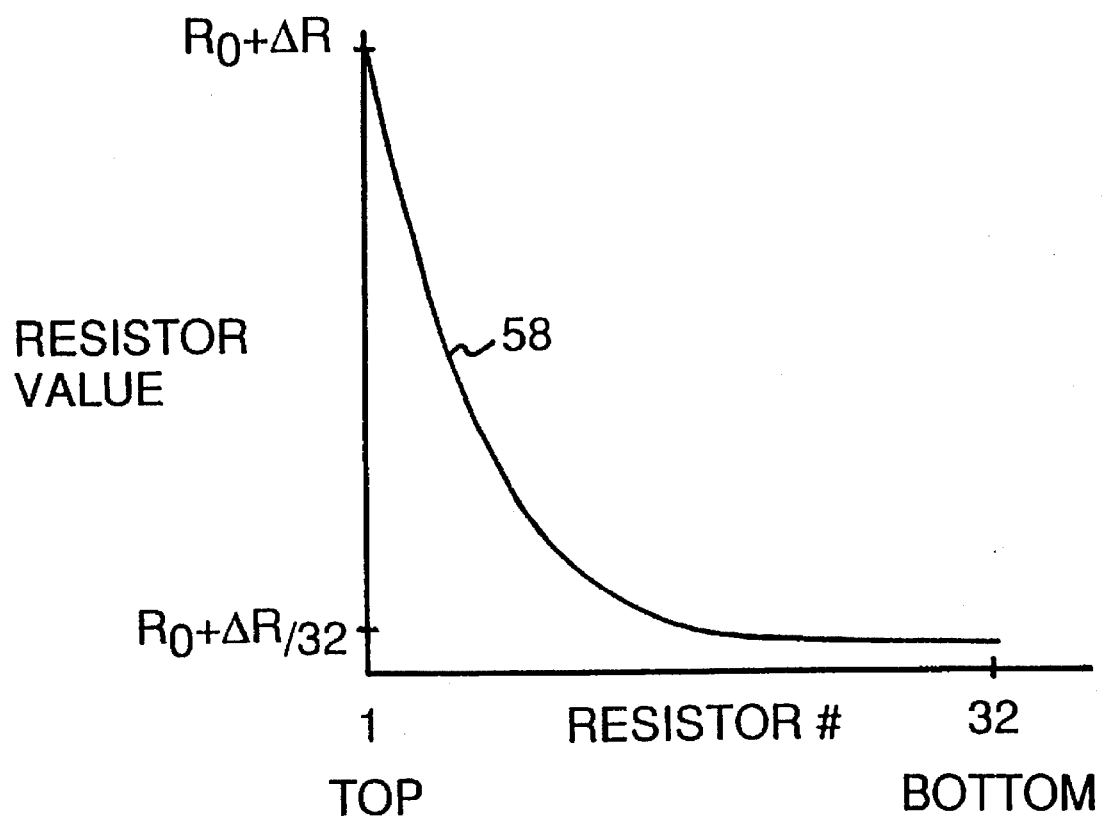
FIG. 8 is a graph illustrating the variance in resistance values of resistors across a string DAC having a non-linear process gradient.

The graph of FIG. 8 illustrates the resistance values of resistors in a string DAC having a non-linear vertical process gradient. The horizontal axis represents each resistor, the total number of resistors being 32 in this example, corresponding to the number of coarse resistors in the preferred embodiment. The vertical axis represents the resistance values in ohms of each resistor. The resistance value of any particular resistor is governed by the equation $R_n = R_o + \Delta R/n$, where $R_n$ is there resistor value in ohms, $R_o$ is the nominal value of the resistor in ohms (i.e., the desired value of the resistor targeted during processing), $\Delta R$ is the variation in resistance value from the top of the DAC to the bottom of the DAC, and n is the number of resistors in the DAC from top to bottom (where n=32 in this example). Curve 58 shows the change in resistance value from the top of the DAC to the bottom of the DAC. As shown, curve 58 is non-linear.

Figure 9:
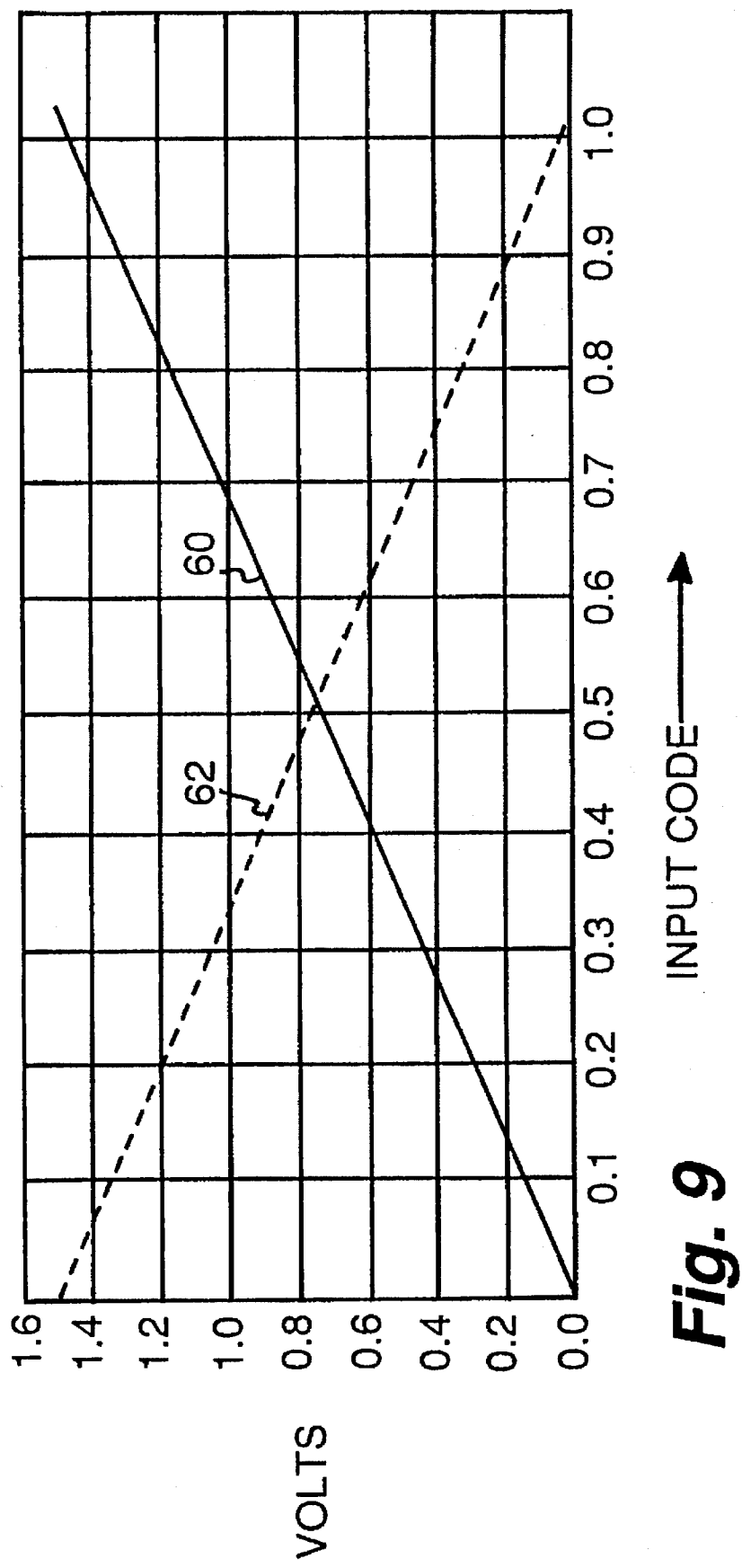
FIG. 9 is a transfer function of a single-ended string DAC having a one percent non-linear process gradient across its surface.

FIG. 9 shows the transfer functions of a positive single-ended string DAC and a negative single-ended string DAC with a non-linear one percent process gradient across the DAC in the vertical direction, taken at a temperature of 27° C. The vertical axis represents the output voltage in volts and the horizontal axis represents the digital input code. Curve 50 shows the output voltage of the positive single-ended DAC and curve 62 (in dashed lines) shows the output voltage of the negative single-ended DAC.

Figure 10:
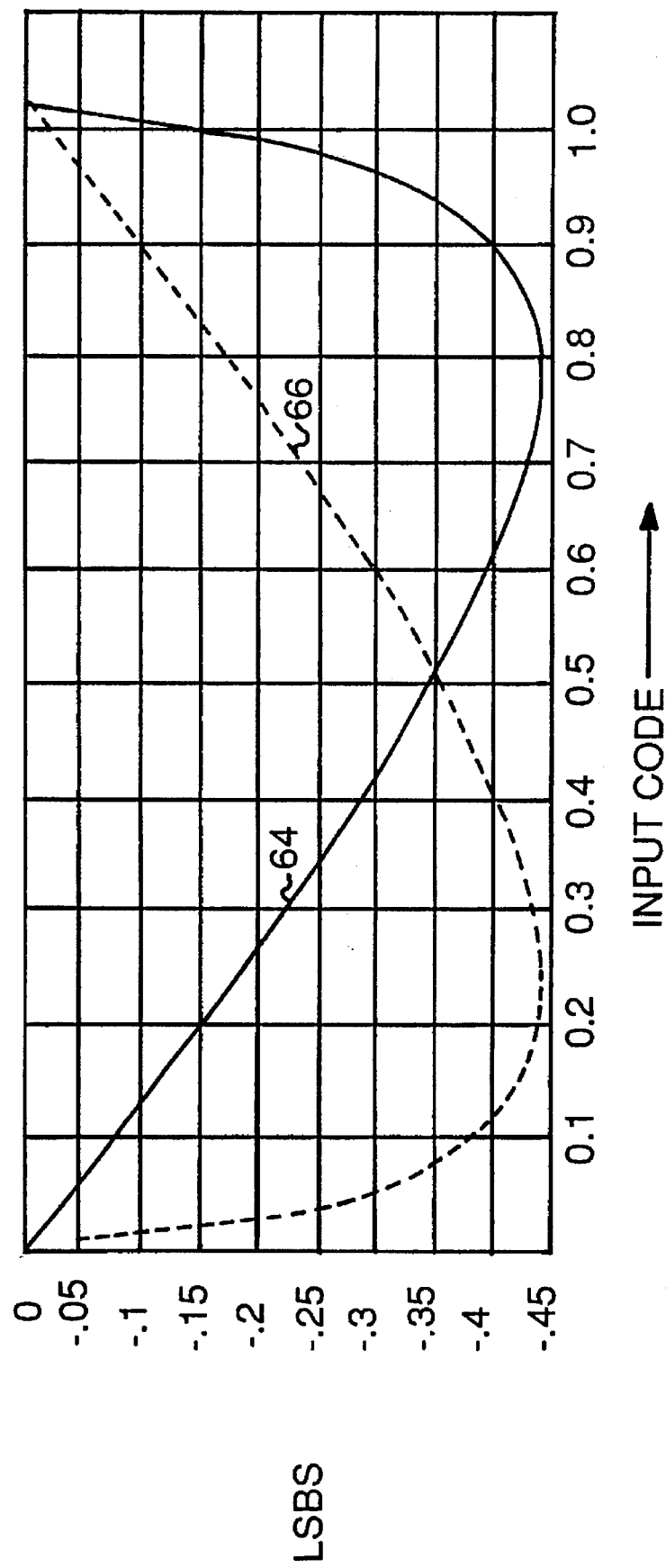
FIG. 10 is a graph of the INL error of a single-ended string DAC having a one percent non-linear process gradient across its surface.

FIG. 10 shows the INL errors in LSBs of the positive single-ended DAC and the negative single-ended DAC, given the conditions described with reference to FIG. 9. Curve 64 shows the INL error of the positive single-ended DAC and curve 66 (in dashed lines) shows the INL error of the negative single-ended DAC. As shown, both the positive single-ended DAC and the negative single-ended DAC have a worst-case INL error of approximately 0.45 LSB. Additionally, the INL errors of the positive and negative single-ended DACs are equal at approximately mid-scale input code.

Figure 11:
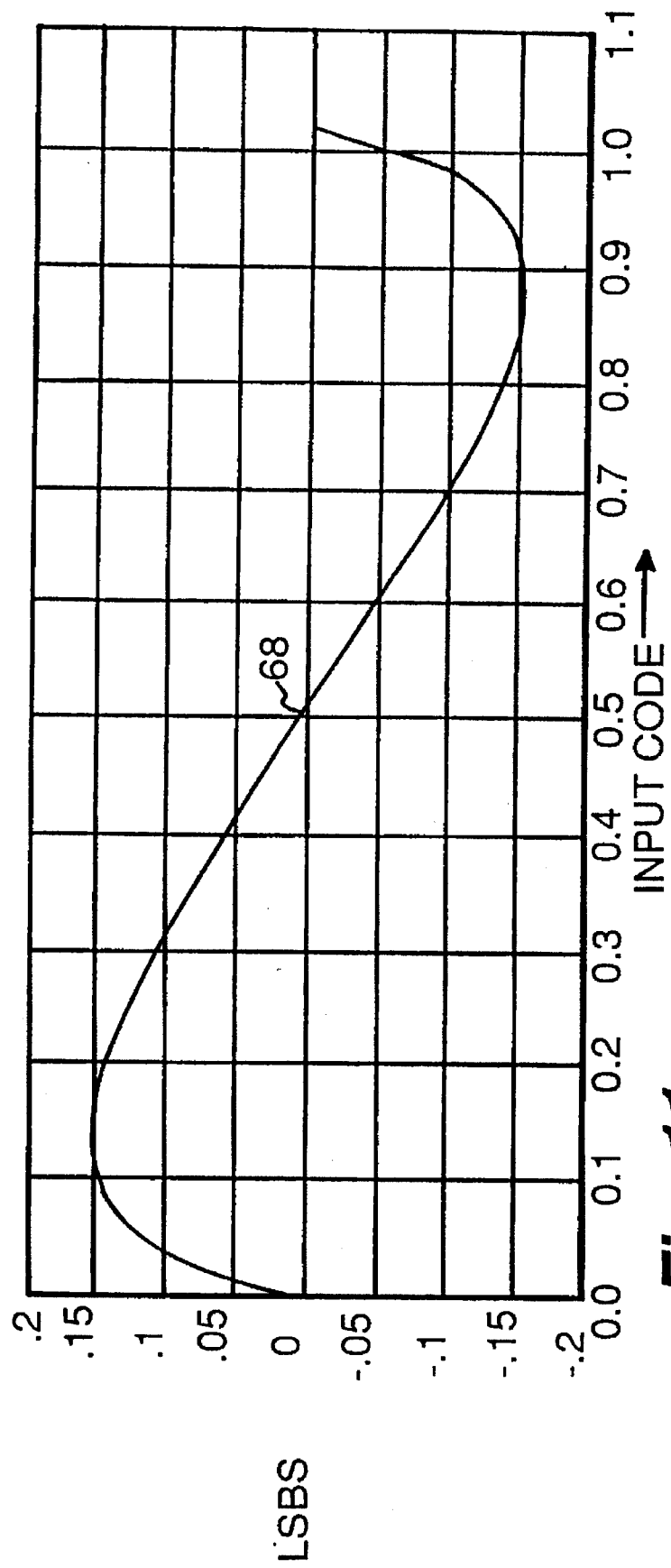
FIG. 11 is a graph of the INL error of the differential string DAC of the present invention having a one percent non-linear process gradient across its surface.

FIG. 11 shows the INL errors (in LSBs) of the differential DAC according to the present invention, given the conditions described above in connection with FIGS. 9 and 10. The INL error of the differential DAC according to the present invention is approximately the difference between the INL errors of the positive single-ended DAC and the negative single-ended DAC (of FIGS. 9 and 10). Curve 68 of FIG. 11 shows the INL error. As shown, the INL error varies between ±0.15 LSB, which range is much less than the INL error range of both the positive and negative single-ended string DACs under the same conditions. Additionally, the INL error of the differential DAC is equal to 0 at approximately mid-scale code.

Thus, as shown and described, the differential string DAC of the present invention offers the advantages that INL errors are greatly reduced for longitudinal process gradients, whether linear or non-linear, due, in part, to the DAC's differential arrangement and symmetrical layout of resistors.

While there have been shown and described what are at present considered the preferred embodiments of the present invention, which have been disclosed by way of example only, it should be obvious to those skilled in the art that various changes and modifications can be made therein without departing from the spirit and scope of the invention as presented above and as defined by the appended claims and equivalents thereto. For example, while the differential string DAC has been shown and described as including a positive sub-DAC and a negative sub-DAC, each with sixteen sub-DAC cells, lesser or greater number of sub-DAC cells could be used. Additionally, while each sub-DAC cell was shown and described as including sixty-four series-connected resistors, any number of resistors, greater or less than sixty-four, could be used.

Further, while the DAC was shown and described as including a positive sub-DAC and a negative sub-DAC being symmetrically disposed about a vertical axis for reducing INL errors due to vertical process gradients, it is within the scope of the invention to symmetrically dispose the positive sub-DAC and negative sub-DAC about a differently oriented axis (i.e., a horizontal axis) to reduce INL errors due to process gradients in a different direction.

In practice, process gradients occur both in the X and Y directions. Gradients in the X direction tend to cause very small and acceptable INL errors but gradients in the Y direction cause much larger INL errors. Accordingly, this invention was described and shown as including a layout for minimizing INL errors caused by gradients in the Y direction.

What is claimed is:

1. A differential string DAC comprising:
   a coarse DAC including a plurality of coarse resistors connected in series between first and second reference voltage leads;
   a positive sub-DAC including a plurality of positive sub-DAC cells, each sub-DAC cell including a plurality of series-connected fine resistors; and
   a negative sub-DAC including a plurality of negative sub-DAC cells, each sub-DAC cell including a plurality of series-connected fine resistors;
   wherein each coarse resistor is electrically connected in parallel with one positive sub-DAC cell and one negative sub-DAC cell, said one positive sub-DAC cell and one negative sub-DAC cell are substantially symmetrically disposed about the coarse resistor.

2. A differential string DAC as claimed in claim 1, wherein all coarse resistors have approximately the same resistance value.

3. A differential string DAC as claimed in claim 2, wherein the coarse DAC includes at least sixteen series-connected coarse resistors.

4. A differential string DAC as claimed in claim 1, wherein the positive sub-DAC includes at least sixteen positive sub-DAC cells and the negative sub-DAC includes at least sixteen negative sub-DAC cells.

5. A differential string DAC as claimed in claim 4, wherein each positive sub-DAC cell includes at least sixty-four series-connected fine resistors and each negative sub-DAC cell includes at least sixty-four series-connected fine resistors.

6. A differential string DAC as claimed in claim 5, wherein all of the fine resistors have approximately the same resistance value.

7. A differential string DAC comprising:
   a plurality of coarse resistors connected in series between first and second reference voltage leads; and
   first and second pluralities of resistor strings, each resistor string including a multitude of series-connected fine resistors;
   wherein each coarse resistor is electrically connected in parallel with one resistor string of the first plurality and one resistor string of the second plurality, the one resistor string of the first plurality and the one resistor string of the second plurality are substantially symmetrically disposed about the coarse resistor.

8. A differential string DAC as claimed in claim 7, wherein all coarse resistors have approximately the same resistance value.

9. A differential string DAC as claimed in claim 8, wherein the plurality of coarse resistors includes at least sixteen coarse resistors.

10. A differential string DAC as claimed in claim 7, wherein the first plurality of resistor strings includes at least sixteen resistor strings and the second plurality of resistor strings includes at least sixteen resistor strings.

11. A differential string DAC as claimed in claim 10, wherein each resistor string includes at least sixty-four series-connected fine resistors.

12. A differential string DAC as claimed in claim 11, wherein all of the fine resistors have approximately the same resistance value.

* * * * *